(12) United States Patent
Mann

(10) Patent No.: US 8,643,824 B2
(45) Date of Patent: *Feb. 4, 2014

(54) PROJECTION OPTICS FOR MICROLITHOGRAPHY

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 274 days.

This patent is subject to a terminal disclaimer.

(21) Appl. No.: 13/045,723

(22) Filed: Mar. 11, 2011

(65) Prior Publication Data

US 2011/0157572 A1    Jun. 30, 2011

Related U.S. Application Data

(63) Continuation of application No. 11/969,476, filed on Jan. 4, 2008, now Pat. No. 7,929,114.

(60) Provisional application No. 60/885,235, filed on Jan. 17, 2007.

(30) Foreign Application Priority Data

Jan. 17, 2007    (DE) .................. 10 2007 003 307

(51) Int. Cl.
    *G02B 17/00*    (2006.01)
    *G03B 27/32*    (2006.01)
    *G03B 27/42*    (2006.01)
    *G03B 27/54*    (2006.01)

(52) U.S. Cl.
    USPC .................. 355/67; 355/53; 355/77; 359/364

(58) Field of Classification Search
    CPC ..................... G02B 17/08; G03F 7/70225
    USPC ............. 355/52, 53, 66, 67, 77; 359/364–366
    See application file for complete search history.

(56) References Cited

U.S. PATENT DOCUMENTS

| 6,000,798 A | 12/1999 | Chipman et al. |
| 6,229,595 B1 | 5/2001 | McKinley et al. |
| 6,266,389 B1 | 7/2001 | Murayama et al. |
| 6,353,470 B1 | 3/2002 | Dinger |

(Continued)

FOREIGN PATENT DOCUMENTS

| DE | 102 12 405 | 10/2002 |
| DE | 101 20 446 | 11/2002 |

(Continued)

OTHER PUBLICATIONS

Office Action for corresponding Application No. JP 2008-529565, dated Dec. 7, 2009.

(Continued)

*Primary Examiner* — Toan Ton
*Assistant Examiner* — Colin Kreutzer
(74) *Attorney, Agent, or Firm* — Fish & Richardson P.C.

(57) ABSTRACT

A projection optics for microlithography, which images an object field in an object plane into an image field in an image plane, where the projection optics include at least one curved mirror and including at least one refractive subunit, as well as related systems, components, methods and products prepared by such methods, are disclosed.

23 Claims, 5 Drawing Sheets

(56) References Cited

U.S. PATENT DOCUMENTS

| | | | |
|---|---|---|---|
| 6,590,718 B2 | 7/2003 | Fuerter et al. | |
| 6,660,552 B2 | 12/2003 | Payne et al. | |
| 6,665,126 B2 | 12/2003 | Shafer et al. | |
| 6,710,917 B2 | 3/2004 | Mann et al. | |
| 6,902,283 B2 | 6/2005 | Dinger | |
| 6,922,291 B2 | 7/2005 | Sunaga et al. | |
| 6,947,210 B2 | 9/2005 | Terasawa | |
| 7,070,289 B2 | 7/2006 | Sasaki et al. | |
| 7,072,102 B2 | 7/2006 | McGuire | |
| 7,114,818 B2 | 10/2006 | Minakata | |
| 7,929,114 B2 * | 4/2011 | Mann | 355/67 |
| 8,107,162 B2 * | 1/2012 | Dodoc et al. | 359/364 |
| 2002/0012100 A1 | 1/2002 | Shafer | |
| 2003/0002023 A1 | 1/2003 | Bunau et al. | |
| 2004/0189968 A1 | 9/2004 | Terasawa | |
| 2005/0134980 A1 | 6/2005 | Mann et al. | |
| 2005/0190435 A1 | 9/2005 | Shafer et al. | |
| 2005/0248856 A1 * | 11/2005 | Omura et al. | 359/726 |
| 2006/0198018 A1 | 9/2006 | Shafer et al. | |
| 2006/0284113 A1 | 12/2006 | Chang et al. | |
| 2007/0195317 A1 | 8/2007 | Schottner et al. | |

FOREIGN PATENT DOCUMENTS

| | | |
|---|---|---|
| DE | 103 59 576 | 7/2005 |
| EP | 0 744 665 | 11/1996 |
| EP | 1 191 378 | 3/2002 |
| EP | 1 434 093 | 6/2004 |
| JP | 2001-185480 | 7/2001 |
| JP | 2002-015979 | 1/2002 |
| JP | 2002-139672 | 5/2002 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2005-172988 | 6/2005 |
| WO | WO 01/88597 A1 | 11/2001 |
| WO | WO 02/44786 A2 | 6/2002 |
| WO | WO 02/48796 | 6/2002 |
| WO | WO 02/056114 | 7/2002 |
| WO | WO 2005111689 A2 * | 11/2005 |
| WO | WO 2006/069725 | 7/2006 |

OTHER PUBLICATIONS

B. Tatian, "Nonrotationally Symmetric Systems: A New Problem for Optical Design and Fabrication, Applications of Geometrical Optics", Proc. SPIE, 39:205, (1973).

B. Tatian, "Testing an Unusual Optical Surface", International Lens Design Conference, Proc. SPIE, 554:139, (1985).

* cited by examiner

PROJECTION OPTICS FOR MICROLITHOGRAPHY

CROSS-REFERENCE TO RELATED APPLICATIONS

This application is a continuation of U.S. application Ser. No. 11/969,476, filed Jan. 4, 2008, now U.S. Pat. No. 7,929,114, which claims priority under 35 U.S.C. §119(e)(1) to U.S. provisional patent application Ser. No. 60/885,235, filed Jan. 17, 2007. U.S. application Ser. No. 11/969,476 also claims priority under 35 U.S.C. §119 to German patent application serial number 10 2007 003 307.0, filed Jan. 17, 2007. The contents of these applications is hereby incorporated by reference.

FIELD

The disclosure relates to a projection optics for microlithography, which images an object field in an object plane into an image field in an image plane, where the projection optics include at least one curved mirror and including at least one refractive subunit, as well as related systems, components, methods and products prepared by such methods.

BACKGROUND

Projection optics for a projection exposure system of are known. In some instances, the components of the refractive subunits contained therein are utilised asymmetrically and only incompletely. Also known are projection optics for projection exposure systems, in which the imaging beam path is guided via a beam splitter cube.

SUMMARY

In one aspect, the disclosure provides a projection optics for microlithography which images an object field in an object plane into an image field in an image plane. The projection optics includes a curved mirror and a refractive subunit. A reflection surface of the mirror is configured as a static free-form surface which cannot be described by a rotationally symmetrical function.

In another aspect, the disclosure provides a microlithography projection exposure system. The system includes an illumination optics configured to guide illumination light toward an object field in an object plane, a projection optics as described in the preceding paragraph.

In a further aspect, the disclosure provides a method that includes using a microlithography projection exposure system as described in the preceding paragraph to produce a microstructured element.

In some embodiments, the disclosure provides a projection optics for a projection exposure system with a relatively simple design and/or that provides effective utilisation of the components of the at least one refractive subunit of the projection optics over the cross section of these components.

In certain embodiments, a projection optics, having a reflection surface of at least one mirror, is configured as a static free-form surface which cannot be described by a rotationally symmetrical function.

It has been recognised that the use of at least one static free-form surface in the projection optics markedly can increase the degrees of freedom during guidance of the imaging light through the projection optics. The use of at least one free-form surface can allow an imaging beam path in the at least one refractive subunit of the projection optics that utilises the components contained therein more effectively than in the prior art. The use of a smaller number of refractive components accordingly can allow a predetermined image-side numerical aperture in the projection optics according to the disclosure. Conversely, a predetermined number of refractive components can allow a larger image-side numerical aperture to be produced than in the prior art. This can lead to the possibility of a projection optics having higher structural resolution. The free-form surface cannot be described by a function which is rotationally symmetrical about a marked axis normal to a surface portion of the optical surface. The free-form surface therefore cannot, in particular, be described by a conic section-aspherical equation. Although aspheres of this conic type differ from a spherical symmetry, they can be described by a rotationally symmetrical function, i.e. by a function which is dependent merely on one parameter, i.e. on the distance from an optical axis, whereas the free-form surfaces have at least two mutually independent parameters to describe the surface. Conic section-aspherical surfaces are therefore not free-form surfaces according to the disclosure. The shape of the border of the optically active surface is generally not significant in this regard. Optically active surfaces which are non-rotationally symmetrically bordered are known. Nevertheless, optically active surfaces of this type can be described by a rotationally symmetrical function, a non-rotationally symmetrically bordered detail of this optical surface being used. The term "static free-form surface" refers to a free-form surface, the shape of which is not actively changed during use of the projection optics for projection. A static free-form surface can also be displaced as a whole for the purposes of adjustment. The free-form surface can, in particular, be designed starting from a planar reference surface or basic shape, from a concave reference surface or from a convex reference. In particular, use may be made of at least one free-form surface designed starting from a curved reference surface. In this case, use is desirably made of a reference surface having a vertex curvature which is constant over the entire reference surface. A conic section-asphere can also be used as the reference surface. The at least one free-form surface differs from a rotationally symmetrical surface, which is optimally adapted to the free-form surface and does not have to correspond to a design reference surface, at most by an amount corresponding, in particular, at least to the amount of a wavelength of the imaging light. This difference from, in particular, at least the amount of a wavelength of the imaging light is in practice always much greater than production tolerances in the manufacture of optical components for microlithography, which are in absolute terms typically 0.1 nm and in relative terms typically $\frac{1}{50}$ or $\frac{1}{100}$ of the wavelength of the illumination light used. If DUV (deep ultraviolet) imaging light is used, this difference is therefore typically more than 100 nm, in particular even more than 500 nm or even more than 1 µm. Even much greater differences between the free-form surface according to the disclosure and an optimally adapted rotationally symmetrical surface are possible. A free-form surface according to the disclosure may be provided by a biconical surface, i.e. an optical surface having two different basic curvatures and two different conical constants in two directions perpendicular to each other, by a toric surface or by an anamorphous and at the same time, in particular, aspherical surface. A cylindrical surface is therefore also a freeform surface of this type. The free-form surfaces according to the disclosure can be mirror-symmetrical to one or more planes of symmetry. The free-form surface according to the disclosure may be a surface having an n-fold symmetry, wherein n is an integer and greater than or equal to 1. The free-form surface may have no axis of symmetry whatsoever and no plane of symmetry whatsoever. The projection optics can have at least two curved mirrors mapping the object field into the image field.

Various possibilities for describing optical surfaces, in particular anamorphous surfaces, are described for example in U.S. Pat. No. 6,000,798. Analytical formulae for describing non-rotationally symmetrical surfaces, in particular anamorphous aspherical surfaces, toric surfaces or biconical aspherical surfaces, are also described in WO 01/88597 A. Insofar as the disclosure of these documents relates to the mathematical description of optical surfaces, these documents are hereby incorporated by reference. Certain optical design programs such as Oslo® and Code V® also allow the description and design of optical systems via mathematical functions via which it is also possible to define non-rotationally symmetrical optical surfaces. The above-mentioned mathematical descriptions relate to mathematical surfaces. An optical surface which is actually optically utilised, i.e. a physical surface of an optical element that is acted on by an illumination beam and that can be described using a mathematical description of this type, generally contains merely a detail of the actual mathematical surface which is also referred to as the parent surface. The mathematical surface therefore also extends beyond the physical, optically active surface. Insofar as an optical system can be described with the aid of a reference axis, some or all of the optically used surface portions can be arranged outside this reference axis in such a way that the reference axis intersects the mathematical surface but not the detail of this mathematical surface that is actually optically utilised.

Field planes arranged parallel to one another facilitate integration of the projection optics into the design environment of the projection exposure system. This can be particularly advantageous if the projection optics is used in a scanning projection exposure system, as the scanning directions can then be guided parallel to one another.

Arrangements having a small object/image offset can lead to a compact projection optics and also facilitate optic tests in which the projection optics is pivoted about an axis extending centrally through the object or image field and located perpendicularly to the corresponding field plane, as in this case the object and image fields do not migrate far during swivelling of the projection optics.

Arrangements of the optical axis relative to the object or image field wherein the intersection of an optical axis of an refractive subunit with the object plane is located in the object field and in particular is centred in the object field, and wherein the intersection of the optical axis of the refractive subunit with the image plane is located in the image field and in particular is centred in the image field allow optimally symmetrical beam guidance of the illumination or imaging light along the optical axis of the at least one refractive subunit of the projection optics. This can be utilised for substantially rotationally symmetrical or even completely rotationally symmetrical illumination of the optical components of the refractive subunit. In the event of residual absorption of illumination light in these optical components, possible repercussions which corresponding heating of the absorbing optical components has on the imaging of the projection optics are also either substantially or completely rotationally symmetrical or have an n-fold symmetry and can therefore be compensated for or corrected relatively easily. The term "n-fold symmetry" means in this connection that rotation through an angle of 360°/n about the optical axis causes any imaging effects present, in particular imaging errors, to merge.

A projection optics having six mirrors can allow for effective wave front and distortion correction via the image field. Alternatively, the projection optics can also be equipped with a different number of mirrors, for example with two or four mirrors. These mirrors may include a free-form surface, although there may also be two or more free-form surfaces, of which at least one free-form surface may be configured as a curved free-form surface. The same applies to a refractive subunit having at most eight lenses. The fewer lenses the refractive subunit has, the lower the transmission losses of the refractive subunit. The more lenses the refractive subunit has, in general, the better the possibilities for wave front and distortion correction are in practice. The refractive subunit can have at least six lenses. A refractive subunit having eight lenses is in this regard a good compromise in terms of the number of lenses. Depending on the imaging demands placed on the projection optics, six or fewer lenses may also be an advantageous compromise between imaging quality and reduction of transmission losses, material and manufacturing costs.

A projection optics having an image-side and an object-side refractive unit of the projection optics, between which at least two mirrors are arranged, of which at least one has a free-form surface, may be configured symmetrically, and this provides advantages for production in the case of the projection optics. Complete symmetry can be achieved only in specific cases in which the imaging scale of the projection optics is 1:1. A reflective subunit having two or else having four mirrors may, for example, be arranged between the refractive subunits.

A beam guidance in a projection optics, wherein the intersection of the optical axis of the object-side refractive unit of the projection optics with the object plane is located in the object field and wherein the intersection of the optical axis of the image-side refractive subunit of the projection optics with the image plane is located in the image field, and a beam guidance in a projection optics, wherein the intersection of the optical axis of the object-side refractive subunit of the projection optics with the object plane is centred in the object field and wherein the intersection of the optical axis of the image-side refractive subunit of the projection optics with the image plane is centred in the image field, have, both for the image-side and for the object-side refractive subunit, the advantages discussed hereinbefore.

A beam guidance in a projection optics, wherein a principal ray of the central field point between two mirrors arranged between the two refractive subunits extends parallel to the optical axis of the two refractive subunits and set apart from the optical axis, allows a symmetrical configuration of a reflective subunit, including the at least two mirrors, of the projection optics between the two refractive subunits, and this also has advantages for production in the manufacture of the optical components of the projection optics. A beam guidance in an projection optics, wherein the optical axes of the two refractive subunits extend parallel and set apart from each other, allows, for example, a point-symmetrical configuration of the optical components of the projection optics, and this also has advantages for production.

A deformable mirror in the region of a pupil plane of the projection optics can compensate for drift effects occurring during operation of the projection optics, for example as a result of thermal influences. The reflection surface of the deformable mirror can be regarded as a non-static free-form surface.

An image field which is larger than 1 mm² can result in a high throughput of the projection optics.

An image-side numerical aperture of at least 0.5 can allow for high resolution of the projection optics. If an immersion system is used, the image-side numerical aperture can be even larger, for example larger than 1.0.

A telecentric projection optics on one of the group of object and image side can increase the flexibility of use thereof. Projection optics having image-side telecentry have an imaging scale which is constant over the entire focus range.

A light source for generating illumination light having a wavelength in the range of from 126 to 248 mm can allow for good structural resolution of the projection exposure system. Typical UV light sources which can be used have wavelengths of 126, 157, 193 and 248 nm.

A projection optics having in the imaging beam path between the object plane and the image plane at least one intermediate image plane can allow, due to the intermediate image plane, the imaging effects of the refractive subunit to be separated from the imaging effect of the at least one curved mirror of the projection optics. This can simplify the design of the projection optics.

The advantages of a projection exposure system for microlithography including a light source for illumination light, an illumination optics for guiding the illumination light toward an object field in an object plane and a projection optics according to the disclosure, can correspond to those previously listed hereinbefore with regard to the projection exposure system according to the disclosure.

The same applies to a manufacturing method including the steps of providing a reticle and a wafer, projecting a structure on the reticle onto a light-sensitive layer of the wafer with the aid of the projection exposure system described above, and producing a microstructure on the wafer, and to the microstructured structural part manufactured thereby.

Exemplary embodiments of the disclosure will be described hereinafter in greater detail with reference to the drawings.

DETAILED DESCRIPTION

Figure 1:
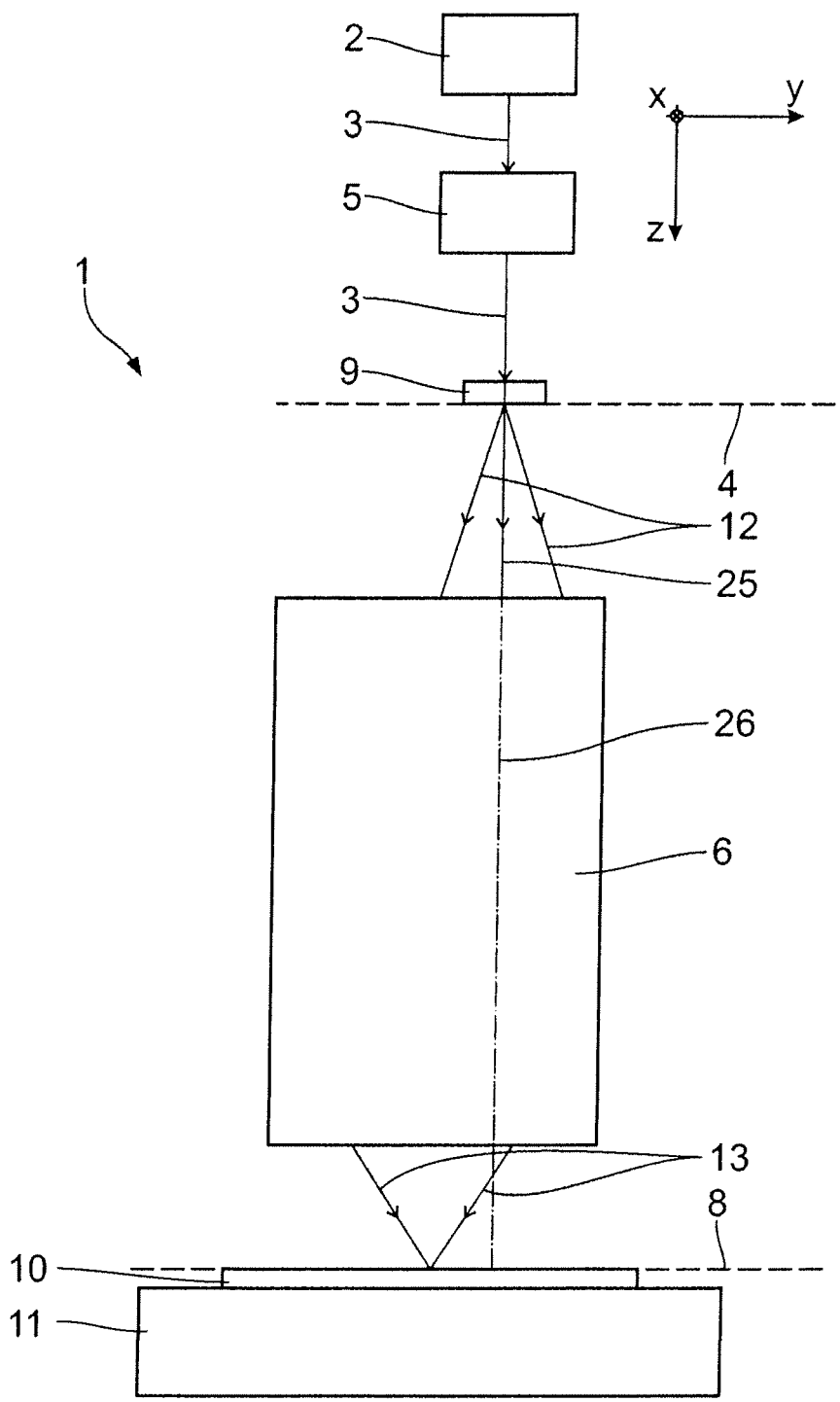
FIG. 1 shows a schematic illustration of a projection exposure system for microlithography.

A projection exposure system 1 for microlithography has a light source 2 for illumination light. The light source 2 is a UV light source generating light having a wavelength of approx. 193 nm. Light sources 2, i.e. lasers, generating wavelengths of this type are known. Other wavelengths, for example 157 nm or 248 nm, which are suitable for refractive media, are also possible. FIG. 1 is a highly schematic illustration of a beam path of the illumination light 3.

Figure 2:
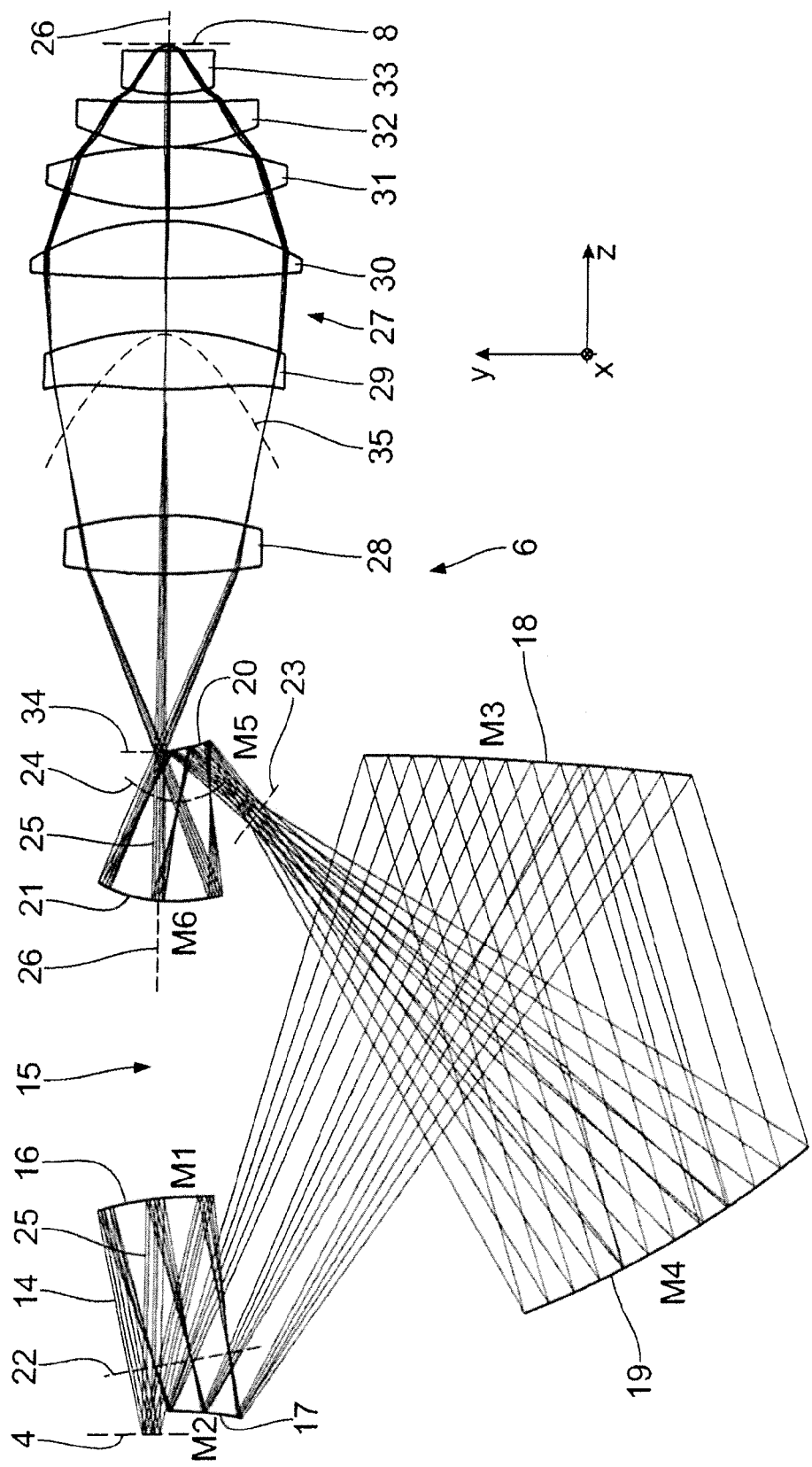
FIG. 2 shows a section, including imaging beam paths of field points set apart from one another, through an embodiment of a projection optics of the projection exposure system according to FIG. 1.

An illumination optics 5 is used to guide the illumination light 3 toward an object field in an object plane 4. The object field is mapped into an image field in an image plane 8 having a predetermined scale of demagnification using a projection optics 6. The projection optics 6, which is shown in detail in FIG. 2, demagnifies by a factor of 4. The image plane 8 is arranged in the projection optics 6 parallel to the object plane 4. A detail, coinciding with the object field, of a mask 9 which is penetrated by radiation and is also referred to as a reticle, is imaged. The imaging is carried out onto the surface of a substrate 10 in the form of a wafer carried by a substrate holder 11. FIG. 1 shows schematically between the reticle 9 and the projection optics 6 a beam cluster 12, entering the projection optics, of the illumination light 3 and between the projection optics 6 and the substrate 10 a beam cluster 13, leaving the projection optics 6, of the illumination light 3. The image field-side numerical aperture of the projection optics 6 according to FIG. 2 is 0.80. The projection optics 6 according to FIG. 2 is telecentric both on the object and on the image side.

To facilitate description of the projection exposure system 1, the drawings show a Cartesian xyz-coordinate system producing the respective positional relationship of the components shown in the figure. In FIG. 1, the x-direction extends into the drawing plane perpendicularly thereto, the y-direction toward the right and the z-direction downward.

The projection exposure system 1 is of the scanner type. Both the reticle 9 and the substrate 10 are scanned in the y-direction during operation of the projection exposure system 1.

FIG. 2 shows the optical design of the projection optics 6. Illustrated is the beam path of the three respective individual beams 14 emanating from five object field points which in FIG. 2 are located one above another and set apart from one another in the y-direction, the three individual beams 14, which pertain to one of these five object field points, each being associated with three different directions of illumination.

Starting from the object plane 4, the individual beams 14 are first reflected by a reflective subunit 15 having a total of six mirrors 16 to 21 which are numbered in the order of the beam path and will subsequently also be referred to, likewise in the order of the beam path, as mirrors M1, M2, M3, M4, M5 and M6. The mirrors 16, 18, 19 and 21 have a concave basic shape, i.e. can be described by a concave optimally adapted surface. The mirrors 17 and 20 have a convex basic shape, i.e. can each be described by a convex optimally adapted surface. In the remainder of the description, mirrors of this type will be described simply as concave or convex.

All six mirrors 16 to 21 of the projection optics 6 are configured as free-form surfaces which cannot be described by a rotationally symmetrical function. Also possible are other embodiments of the projection optics 6, in which at least one of the mirrors 16 to 21 has a free-form reflection surface of this type. At least one reflection surface is in this case configured as a static free-form surface, i.e. a surface, the shape of which cannot be purposefully altered during operation or during downtime of the projection exposure system 1, which surface cannot be described by a rotationally symmetrical function.

In the exemplary embodiment shown in FIG. 2, planar pupil or intermediate image planes may generally not be allocated to the projection optics 6. Both pupils and intermediate images are generated in the reflective subunit 15 on pupil surfaces or intermediate image surfaces extending transversely to the beam path of the individual beams 14 having complex topography. Surfaces of this type, which are indicated in FIG. 2 by straight or curved lines, will be referred to hereinafter simply as pupil or intermediate image planes.

A first pupil plane 22 is located between the first mirror 16 and the second mirror 17 of the projection optics 6. A first intermediate image plane 23 of the projection optics 6 is located between the fourth mirror 19 and the fifth mirror 20. The numerical aperture in the intermediate image plane 23 is approximately 0.17. A second pupil plane 24 of the projection optics 6 is located between the fifth mirror 20 and the sixth mirror 21.

A marked individual beam 14, which connects a central object field point to a point in the pupils of the projection optics 6 in the pupil planes 22, 24, will be referred to hereinafter also as the principal ray 25 of the central field point. From reflection on the sixth mirror 21, the principal ray 25 of the central field point encloses with the image plane 8 roughly a right angle, i.e. extends also substantially parallel to the z-axis of the projection exposure system 1. This angle is in any case greater than 85°. From reflection on the sixth mirror 20, the principal ray 25 extends along an optical axis 26 of a refractive subunit 27, connected to the reflective subunit 15, of the projection optics 6. The intersection of the optical axis 26 of the refractive subunit 27 with the image plane 8 is located centrally in the image field.

The refractive subunit 27 has a total of six lenses 28 to 33 which are numbered in the order of the beam path between the object plane 4 and the image plane 8.

A second intermediate image plane 34 of the projection optics 6 is located between the sixth mirror 21 of the reflective subunit 15 and the first lens 28 of the refractive subunit 27. The numerical aperture of the projection optics 6 in the intermediate image plane 34 is 0.37.

Located between the first lens 28 and the second lens 29 is a third pupil plane 35 of the projection optics 6, in which for example an aperture stop can be arranged.

The image field of the projection optics 6 in the image plane 8 is rectangular. Parallel to the x-direction, the image field has an extension of 26 mm. Parallel to the y-direction, the image field has an extension of 6 mm. The optical axis 26 passes through the image field centrically, i.e. at the intersection of the diagonals thereof.

The projection optics 6 dispenses with a beam splitter cube and a planar folding mirror and thus has a particularly small number of optical components.

Figures 3, 4:
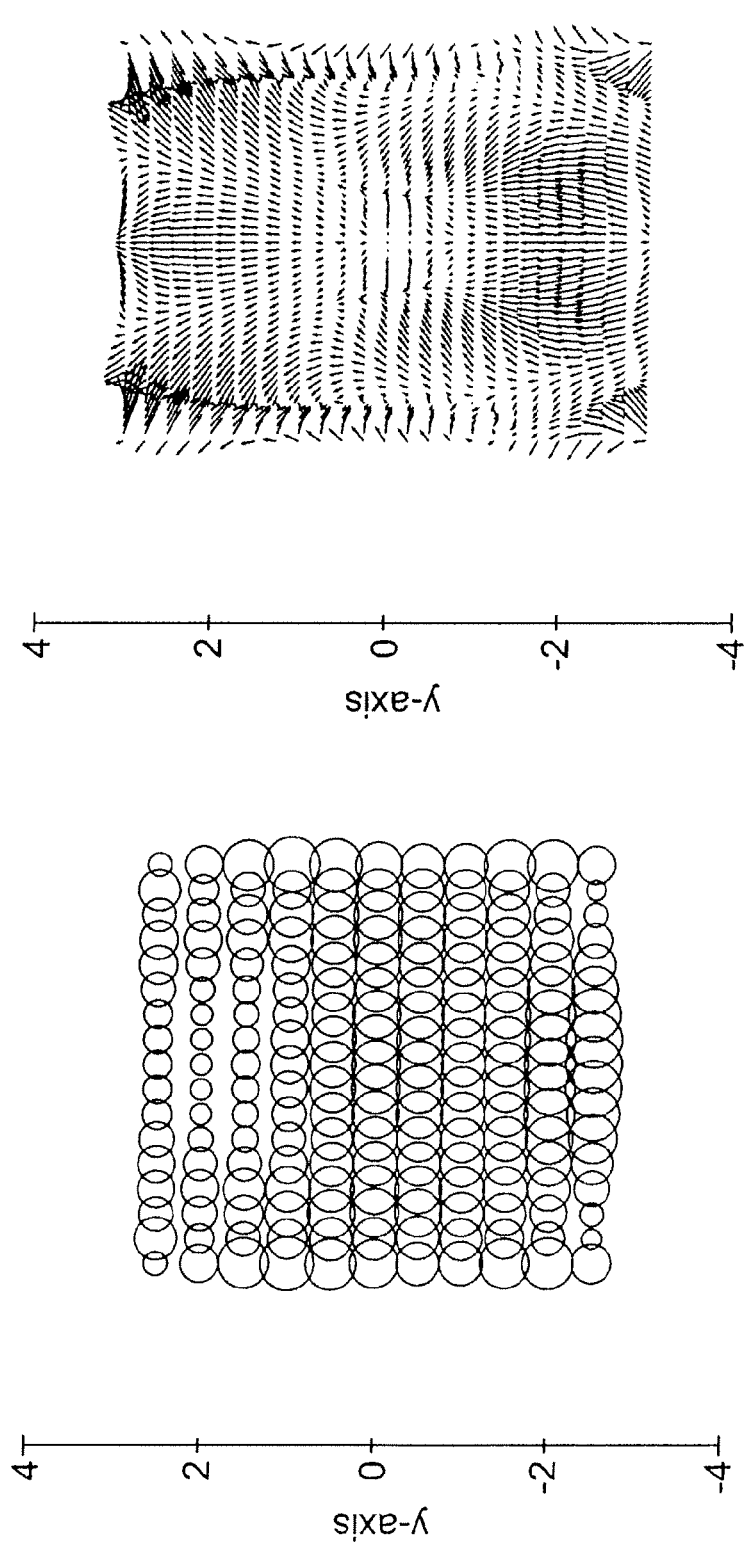
FIG. 3 shows a diagram showing the field profile of the wave front error (rms value) of the projection optics according to FIG. 2.
FIG. 4 shows a diagram showing the field profile of the distortion of the projection optics according to FIG. 2.

FIG. 3 shows the field profile of the wave front of the projection optics 6 according to FIG. 2 in the image field. The scale of the y-axis is in this case shown stretched compared to that of the x-axis. FIG. 3 shows a wave front correction to a value of at most 80 m$\lambda$. The smallest wave front error occurs at relatively high positive y-values, based on the x-axis, centrically and at relatively high negative y-values eccentrically.

FIG. 4 shows the profile of the distortion via the image field of the projection optics 6 according to FIG. 2. The scale of the x-axis and the y-axis corresponds to the scale of FIG. 3. The distortion is corrected to a maximum value of approximately 25 nm. This maximum value occurs at high y-values located, with respect to x, at the edge of the image field. As may be seen, the image error profile no longer extends rotationally symmetrically around the centre of the field, as is the case in conventional rotationally symmetrical systems having a centred object field and image field.

The generation of a free-form surface 36 from a rotationally symmetrical reference surface 37 will be described hereinafter with reference to FIG. 5.

Firstly, information for characterising the viewed free-form surface is obtained with the aid of an optical design program. The reference surface 37 may, for example, be a rotationally symmetrical asphere. The design information may include the radius of curvature of the reference surface 28, which is also denoted as 1/c, wherein c denotes the peak curvature of the reference surface 37. The information additionally includes a conical constant k of the reference surface 37 and polynomial coefficients describing the reference surface 37.

Alternatively or additionally, information characterising the reference surface 37 can be obtained from a surface measurement of a reference mirror surface, for example using an interferometer. A surface measurement of this type produces a function $z'(x', y')$ describing the reference surface 37, wherein z' denotes the pitch of the reference surface 37 along the z'-axis for various (x', y') coordinates, as shown in FIG. 5.

This first step in the design of the free-form surface 36 additionally includes determining that portion of the initially unlimited mirror surface, defined only by the surface description, that is actually utilised for the reflection of illumination or imaging light 3 during the mapping of the object field into the image field. This region is also referred to as a footprint. The footprint of the mirror can be determined, at least approximately, by ray tracing of the projection optics 6. Examples of a possible footprint in the x-dimension are indicated in FIG. 5. xmin denotes the lower limit and xmax the upper limit for the exemplary footprint. The data above xmax and below xmin is also calculated within certain limits so as to avoid undesirable edge effects when determining the free-form surface 36. Once the information characterising the reference surface 37 has been determined, a local coordinate system for the reference surface 37 is introduced, in which both the decentring and the tilting of the reference surface 37 are each zero. The z'-axis is therefore the rotational axis of symmetry of the aspherical reference surface 37 or else, if the reference surface was obtained by surface measurement, the optical axis of the measuring device, for example the interferometer. The z'-axis is generally displaced and tilted parallel relative to the z-axis of the xyz-coordinate system of the projection exposure system 1. This applies accordingly to the other coordinate axes x', y'. This parallel displacement or tilting is defined in the initial step of the optical design of the free-form surface.

As an alternative to an asphere, the reference surface 37 may also be a spherical surface. The coordinate origin $x_c$, $y_c$, $z_c$ for describing the spherical reference surface 37 generally differs from the origin of the xyz-coordinate system of the projection exposure system 1.

Once the reference surface 37 has been determined, a local distance $d_i$ (i=1 . . . N) between a number of points on the reference surface 37 and points on the freeform surface 36 is determined parallel to the z'-axis. The various local distances $d_i$ are then varied until a group of secondary conditions is fulfilled. These secondary conditions are predetermined limit values for specific imaging errors and/or illumination properties of the projection optics 6.

The free-form surface can be described mathematically by the following equation:

$$Z = \frac{cr^2}{1 + \sqrt{1 - (1+k)c^2 r^2}} + \sum_{j=2}^{66} C_j X^m Y^n$$

-continued wherein:

$$j = \frac{(m+n)^2 + m + 3n}{2} + 1$$

Figure 5:
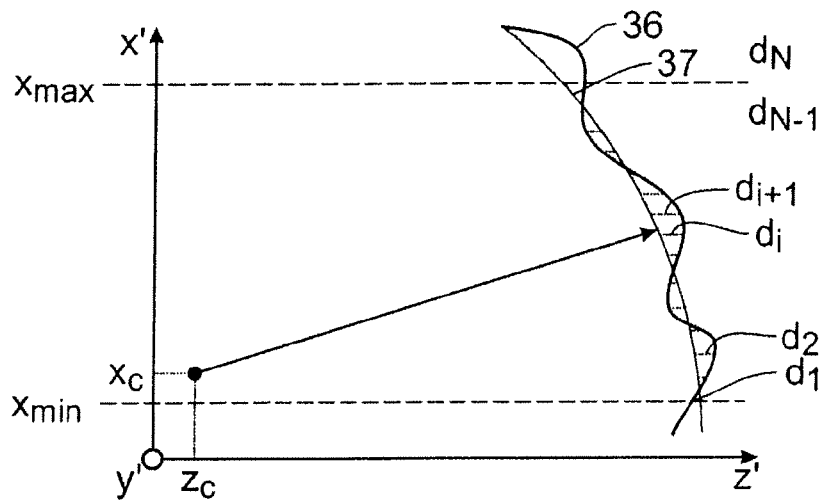
FIG. 5 shows a section through a non-rotationally symmetrical free-form surface and through a rotationally symmetrical reference surface.

Z is the pitch of the free-form surface parallel to a Z-axis which may, for example, be parallel to the z'-axis according to FIG. 5.

c is a constant corresponding to the peak curvature of a corresponding asphere. k or K corresponds to a conical constant of a corresponding asphere. $C_j$ are the coefficients of the monomials $X^m Y^n$. Typically, the values of c, k and $C_j$ are determined on the basis of the desired optical properties of the mirror within the projection optics 6. The order of the monomial, m+n, can be varied as desired. A relatively high-order monomial can lead to a design of the projection optics 6 having better image error correction but is more complex to calculate. m+n may assume values between 3 and greater than 20.

Free-form surfaces can also be described mathematically by Zernike polynomials, an account of which is provided, for example, in the manual of the optical design program CODE V®. Alternatively, free-form surfaces can be described with the aid of twodimensional spline surfaces. Examples of these include Bezier curves or non-uniform rational basis splines (NURBS). Two-dimensional spline surfaces can, for example, be described by a network of points in an xy-plane and associated z-values or by these points and gradients associated therewith. Depending on the respective type of spline surface, the whole surface is obtained by interpolation between the network points using, for example, polynomials or functions having specific properties in terms of their continuity and differentiability. Examples of these include analytic functions.

Figure 6:
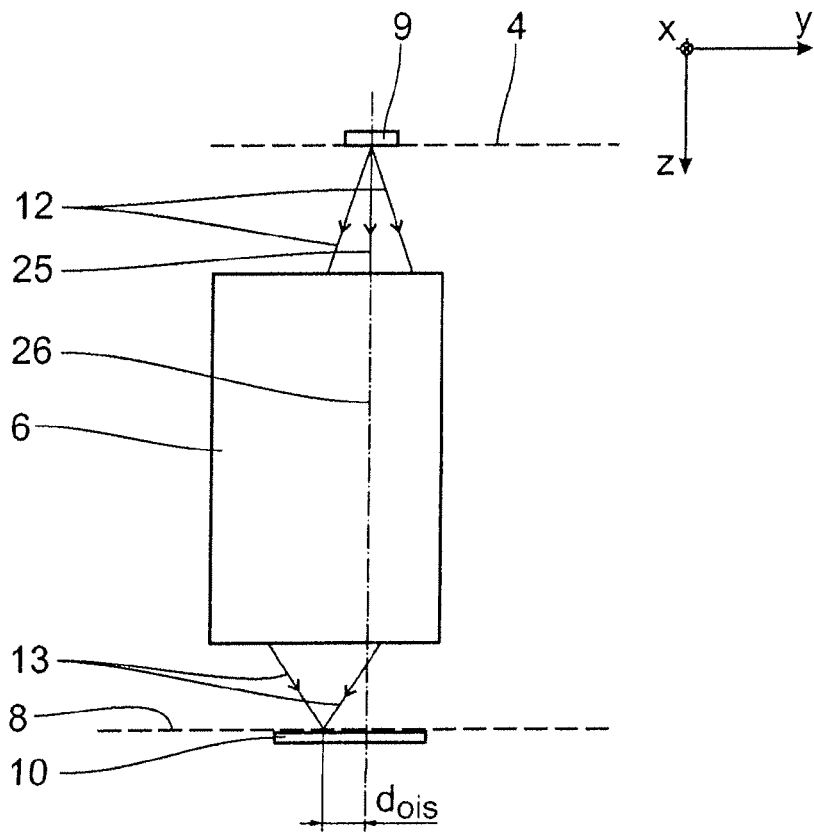
FIG. 6 shows a view similar to FIG. 1 of a projection exposure system for microlithography.

FIG. 6 is, again, a slightly modified view of the projection exposure system 1 to illustrate a further value characteristic of the projection optics 6, i.e. the object/image offset $d_{ois}$. The object/image offset is defined as the distance between a perpendicular projection of the central object point onto the image plane 8 and the central image point. Equivalent to this definition is a definition of the object/image offset as the distance between the central object point and the intersection of the optical axis 26 of the refractive subunit with the object plane. This equivalence is due to the fact that the central image point is located on the optical axis of the refractive subunit. In the projection optics 6 according to FIG. 2, the object/image offset $d_{ois}$ is 0. In particular, the object field is in the projection optics 6 at a distance of less than 50 mm from the intersection of the optical axis 26 of the refractive subunit 27 with the object plane 4. This intersection is located centrically in the object field.

Characteristic parameters of the projection optics will be recapitulated hereinafter. The wavelength of the illumination light 3 is 193.3 nm at a bandwidth of 0.3 pm. The image-side numerical aperture of the projection optics is 0.8. The image field size is 6×26 mm². The projection optics is telecentric on the input and output sides.

The following first table sets out the radii R, i.e. the reciprocal values of the peak curvatures c, and the distances between the optical components of the projection optics 6 in the z-direction (thickness). Mirror 1 to mirror 6 denote in this case the mirrors M1 to M6 of the projection optics 6. Lens 1a and lens 1b denote the object-side and the image-side surface of the lens 28. Accordingly, the lines from lens 2a denote the subsequent lens surfaces up to the image-side surface of the lens 33.

The subsequent second, two-line table sets out the index of refraction of the material SILUV, selected for the lenses 28 to 33, within the bandwidth of the illumination light.

| Surface | Radius | Thickness | Mode/Material |
| --- | --- | --- | --- |
| Object | INFINITY | 270.081 | |
| Mirror 1 | −252.965 | −238.081 | REFL |
| Mirror 2 | −406.220 | 891.920 | REFL |
| Mirror 3 | −979.012 | −891.920 | REFL |
| Mirror 4 | 1445.893 | 891.920 | REFL |
| Mirror 5 | 223.730 | −194.805 | REFL |
| Mirror 6 | 214.750 | 447.659 | REFL |
| Lens 1a | 917.582 | 80.000 | SILUV |
| Lens 1b | −395.946 | 113.054 | |
| STOP | INFINITY | 61.038 | |
| Lens 2a | 728.174 | 80.000 | SILUV |
| Lens 2b | −447.709 | 72.468 | |
| Lens 3a | 1274.086 | 80.000 | SILUV |
| Lens 3b | −344.145 | 16.037 | |
| Lens 4a | 287.238 | 83.816 | SILUV |
| Lens 4b | −560.707 | 2.069 | |
| Lens 5a | 291.341 | 59.824 | SILUV |
| Lens 5b | 584.886 | 15.839 | |
| Lens 6a | 471.437 | 55.444 | SILUV |
| Lens 6b | INFINITY | 10.001 | |
| Image | INFINITY | 0.000 | |

| | | | |
| --- | --- | --- | --- |
| Wavelength | 193.400 | 193.300 | 193200 |
| SILUV | 1.560332 | 1.560491 | 1.560650 |

The following table sets out the coefficients $C_j$ of the monomials $X^m Y^n$ in the above-indicated free-form surface equation for the mirrors M1 to M6.

| Coefficient | M1 | M2 | M3 | M4 | M5 | M6 |
| --- | --- | --- | --- | --- | --- | --- |
| K | −7.021612E−01 | −2.157890E+00 | −7.667374E−01 | −1.806988E+00 | 1.063503E+00 | −1.746422E−01 |
| Y | 0.000000E+00 | 0.000000E+00 | 0.000000E+00 | 0.000000E+00 | 0.000000E+00 | 0.000000E+00 |
| X2 | 9.095147E−04 | 3.668196E−04 | 2.973173E−04 | −4.649230E−05 | −1.183376E−03 | −3.419562E−04 |
| Y2 | 6.389416E−04 | 2.560392E−04 | 2.978561E−04 | −7.671144E−05 | −9.182562E−04 | −3.007775E−04 |
| X2 | −8.076564E−07 | −6.252867E−07 | −3.355736E−08 | −6.400021E−08 | 9.454888E−06 | 2.940059E−07 |
| Y3 | −2.117970E−06 | −5.447745E−07 | −2.754244E−08 | −1.460071E−08 | 6.613284E−07 | 1.847585E−07 |
| X4 | −2.138970E−10 | −8.640102E−09 | 3.920489E−11 | 8.751552E−11 | −4.472091E−08 | −1.426177E−09 |
| X2Y2 | −6.007701E−09 | −2.165820E−08 | 6.203578E−11 | 3.851618E−11 | 1.500646E−07 | −1.613361E−09 |
| Y4 | −9.250730E−09 | −6.779145E−09 | 6.568625E−11 | 1.229035E−10 | −1.127945E−07 | −1.408353E−09 |
| X4Y | −2.056552E−11 | −8.895852E−12 | −1.220037E−14 | 2.660699E−13 | −2.255937E−09 | 4.795621E−12 |
| X2Y3 | −4.739414E−11 | 5.099086E−12 | −6.214499E−14 | −8.442145E−15 | 3.342074E−09 | 7.024093E−12 |
| Y5 | −3.327059E−11 | 2.955670E−11 | 7.082062E−14 | 8.855762E−14 | −1.023558E−09 | −2.144019E−13 |

-continued

| Coefficient | M1 | M2 | M3 | M4 | M5 | M6 |
|---|---|---|---|---|---|---|
| X6 | −1.832168E−14 | −1.470440E−13 | −5.507976E−18 | −3.219684E−17 | −1.402903E−11 | −2.945400E−15 |
| X4Y2 | −1.922635E−13 | −1.214485E−12 | 9.317572E−17 | 5.849016E−16 | −7.112824E−11 | −4.171618E−15 |
| X2Y4 | −1.575366E−13 | −3.577373E−14 | 2.207096E−16 | −7.153565E−17 | 3.488042E−11 | −2.806538E−14 |
| Y6 | −8.968203E−14 | 7.845522E−13 | 7.803209E−17 | 2.198865E−17 | 3.795039E−12 | −3.038365E−14 |
| X6Y | −1.281116E−16 | −2.627145E−15 | −4.849826E−20 | −9.242214E−20 | −4.829253E−13 | 1.984066E−16 |
| X4Y3 | −9.140726E−16 | −3.557075E−15 | 3.159899E−19 | 6.234055E−19 | −1.008249E−12 | 4.813599E−16 |
| X2Y5 | −2.413169E−16 | 1.757810E−15 | 9.795658E−19 | −2.688674E−19 | 1.917495E−13 | 3.980208E−16 |
| Y7 | −3.754943E−16 | 5.872039E−15 | −9.221194E−20 | −7.819713E−21 | 1.901940E−13 | 3.896110E−17 |
| X8 | 5.695077E−20 | 7.943905E−18 | −5.452381E−23 | −1.225852E−22 | 3.587655E−15 | −4.740965E−19 |
| X6Y2 | −1.254065E−18 | 2.689048E−16 | −1.335406E−22 | −3.678195E−23 | −7.156201E−15 | −7.811848E−19 |
| X4Y4 | −1.658577E−18 | 3.240175E−16 | 4.953597E−22 | 4.109732E−22 | −6.930341E−15 | 6.890495E−19 |
| X2Y6 | 4.989886E−20 | 1.087723E−17 | 1.704149E−21 | −2.812559E−22 | −3.664911E−16 | 2.629890E−19 |
| Y8 | −1.551184E−18 | 2.695661E−17 | −3.595780E−22 | 2.753738E−23 | 1.738454E−15 | 5.135593E−20 |
| X8Y | −9.973638E−21 | 1.930861E−18 | −1.667244E−25 | −2.536190E−25 | 9.857871E−17 | −1.714248E−21 |
| X6Y3 | −7.606565E−21 | 6.217397E−18 | −2.273189E−25 | 1.022753E−25 | −6.200635E−17 | −6.960381E−21 |
| X4Y5 | 4.843747E−22 | 4.566777E−18 | 2.515461E−25 | 2.188836E−25 | −1.792880E−17 | −9.623084E−21 |
| X2Y7 | 1.828007E−23 | −1.014580E−19 | 1.345882E−24 | −1.041776E−25 | −9.929708E−18 | −5.083648E−21 |
| Y9 | −3.672869E−21 | 3.548978E−20 | −3.911346E−25 | 3.732796E−26 | 6.950217E−18 | 1.389683E−21 |
| X10 | −2.139041E−23 | 3.593455E−21 | −1.343515E−29 | −1.288642E−29 | 3.181161E−19 | 1.291645E−23 |
| X8Y2 | −4.164394E−23 | 1.984011E−20 | −1.655578E−28 | −1.291875E−28 | 4.620193E−19 | 8.021568E−23 |
| X6Y4 | −1.391966E−23 | 3.356495E−20 | −1.667437E−28 | 9.320319E−29 | −2.306996E−19 | 1.145367E−22 |
| X4Y6 | 2.959150E−24 | 1.871129E−20 | 4.168020E−30 | 8.701089E−29 | −9.628058E−21 | −2.791674E−23 |
| X2Y8 | −1.066355E−24 | 2.488743E−22 | 4.086345E−28 | 3.310765E−31 | −4.149211E−20 | −9.425279E−23 |
| Y10 | −3.494516E−24 | 1.039002E−22 | −1.471588E−28 | 1.304435E−29 | 9.112470E−21 | −4.264041E−23 |
| Nradius | 1.000000E+00 | 1.000000E+00 | 1.000000E+00 | 1.000000E+00 | 1.000000E+00 | 1.0000000E+00 |

The following two-line table sets out for the mirrors M1 to M6 the amounts in mm by which each mirror, starting from an initial design, is decentred (Y-decentre) and rotated (X-rotation). This corresponds to the parallel displacement and the tilting during the above-described free-form surface design process. Displacement is in this case carried out in the y-direction and tilting about the x-axis.

| Coefficient | M1 | M2 | M3 | M4 | M5 | M6 |
|---|---|---|---|---|---|---|
| Y-decentre | 163.446 | −22.380 | −119.285 | 124.459 | 36.347 | −37.190 |
| X-rotation | 29.034 | −0.370 | 3.988 | 1.234 | 7.717 | 3.171 |

The following table sets out the aspherical constants for the curved surfaces of the lenses 28 to 33.

| | Lens 1b | Lens 2a | Lens 3° | Lens 4a | Lens 5b | Lens 6a |
|---|---|---|---|---|---|---|
| K | −5.320892E+00 | 0.000000E+00 | 0.000000E+00 | −4.766092E+00 | 0.000000E+00 | 0.000000E+00 |
| A | 0.000000E+00 | −1.988938E−08 | −1.463509E−09 | 0.000000E+00 | −9.475075E−08 | −3.645569E−08 |
| B | 1.887087E−13 | −1.531838E−13 | −6.363694E−14 | −6.652848E−13 | 7.801991E−12 | 9.565989E−12 |
| C | −2.425975E−18 | −1.077221E−18 | 4.281797E−19 | 2.251669E−17 | −3.331273E−16 | −9.233817E−16 |
| D | 1.942174E−24 | −2.420592E−23 | −1.251778E−23 | −6.275180E−23 | 1.114370E−20 | 7.314484E−20 |
| E | 1.934240E−27 | −8.586290E−28 | 3.666866E−29 | −3.691459E−27 | −5.980525E−25 | −9.261069E−24 |

K and A to E are in this case coefficients in the following aspherical equation:

$$Z = \frac{ch^2}{\sqrt{1-(1+K)c^2h^2}} + Ah^4 + Bh^6 + Ch^8 + Dh^{10} + Eh^{12}$$

In this case, Z is the pitch of the aspherical surface, c is the peak curvature, K is the conicity, h denotes the respective location on the lens surface at which the pitch is calculated ($h^2 = x^2 + y^2$). The coefficients A to E are assigned to the respective even-numbered orders of h.

Figure 7:
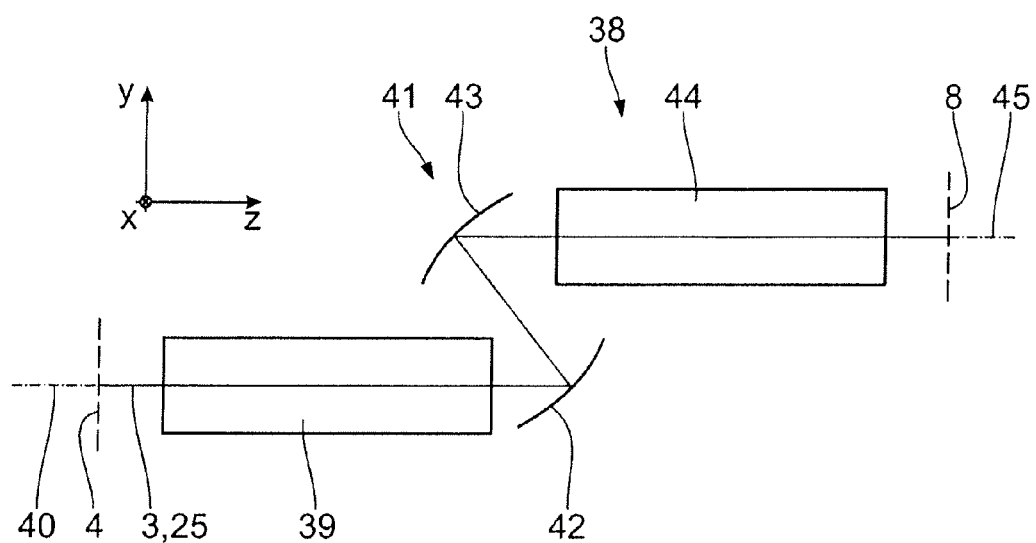
FIG. 7 shows a schematic illustration of a projection optics for the projection exposure system according to FIG. 1.

FIG. 7 shows a projection optics 38 which can be used instead of the projection optics 6 in the projection exposure system 1. Components or reference variables corresponding to those previously described hereinbefore with reference to FIGS. 1 to 6 have the same reference numerals and will not be discussed again in detail. The imaging beam path through the projection optics 38 is shown in FIG. 7 merely based on the principal ray 25 of the central field point.

Starting from the projection plane 4, the projection optics 38 has firstly a refractive subunit 39. The refractive subunit is arranged in such a way that the principal ray 25 extends through the refractive subunit 39 along an optical axis 40 of the refractive subunit 39. The refractive subunit 39 can include one or more lenses.

After the refractive subunit 39, the illumination light 3 is reflected by a reflective subunit 41 of the projection optics 38. The reflective subunit 41 has two mirrors 42, 43, both of which have static reflection free-form surfaces which cannot be described by a rotationally symmetrical function. The mirrors 42, 43 are numbered in accordance with their order in the imaging beam path in the projection optics 38. The mirrors 42 and 43 are concave.

After the mirror 43, the illumination light 3 extends through a second refractive subunit 44 of the projection optics 38. The principal ray 25 extends, in turn, along an optical axis 45 of the second refractive subunit 44. The second refractive subunit 44 can have one lens or a plurality of lenses.

The projection optics 38 has between the object plane 4 and the image plane 8 one or more intermediate image planes. The intermediate image planes can, for example, be arranged between the first refractive subunit 39 and the reflective subunit 41 or else between the reflective subunit 41 and the second refractive subunit 44.

Figure 8:
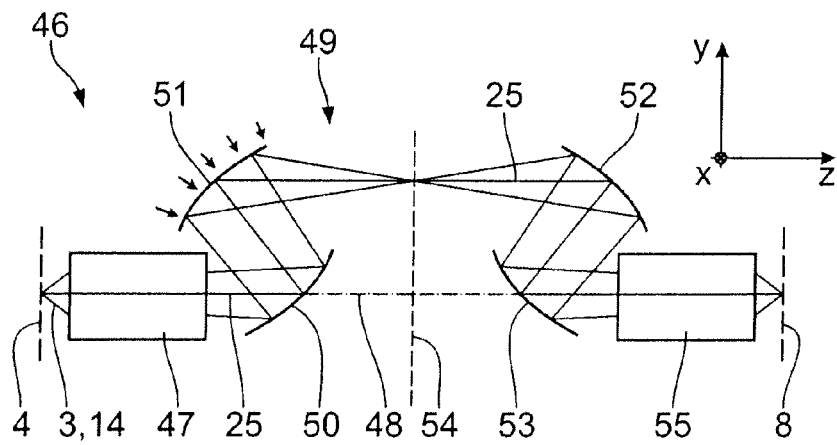
FIG. 8 shows a schematic illustration of a projection optics for the projection exposure system according to FIG. 1.

FIG. 8 is an illustration similar to FIG. 7 of a projection optics 46 which can be used instead of the projection optics 6 in the projection exposure system 1. Components or reference variables corresponding to those previously described hereinbefore with reference to FIGS. 1 to 7 have the same reference numerals and will not be discussed again in detail.

The illumination light 3 in the projection optics 46 is illustrated in FIG. 8 based on three individual beams 14 emanating from an object point. The central individual beam 14 is in this case the principal ray 25.

Starting from the object field 4, the illumination light 3 first passes through a refractive subunit 47 which can be configured so as to correspond to the refractive subunit 39 according to FIG. 7. The principal ray 25 passes through the refractive subunit 47, on the optical axis 48 thereof.

After the refractive subunit 47, the illumination light 3 passes through a reflective subunit 49 of the projection optics 46. The reflective subunit 49 has a total of four reflecting mirrors 50, 51, 52, 53 which are numbered in the order in which they are acted on in the imaging beam path. The mirrors 50 to 53 are concave. However, convex mirrors can also be used in this subunit. A pupil plane of the projection optics 46 is arranged in the region of the second mirror 51. An intermediate image plane 54 of the projection optics 46 is arranged between the mirrors 51 and 52. The optical axis 48 is, for example, perpendicular to the intermediate image plane 54. Between the mirrors 51 and 52, the principal ray 25 extends substantially parallel to the optical axis 48. The principal ray 25 can also extend between the mirrors 51 and 52 at an angle to the optical axis 48.

After the last mirror 53 of the reflective subunit 49, the illumination light 3 passes through a second refractive subunit 55 of the projection optics 46.

In relation to the intermediate image plane 54, the optical components of the three subunits 47, 49 and 55 of the projection optics 46 are arranged substantially symmetrically to one another. The optical axis of the second refractive subunit 55 coincides with the optical axis 48 of the first refractive subunit 47. A further pupil plane of the projection optics 46 is arranged in the region of the third mirror 52.

The four mirrors 50 to 53 of the reflective subunit 49 all have a reflection free-form surface which cannot be described by a rotationally symmetrical function. The free-form surfaces of the mirrors 50, 52 and 53 are in this case static. The reflection surface of the second mirror 51 is deformable, i.e. non-static, in its configuration. Alternatively or additionally, the reflection surface of the third mirror 52 can also be deformable in its configuration. This allows, for example, drift effects, which can occur during projection exposure with the projection exposure system 1, to be corrected. A correction mechanism including corrections sensors can be used for this purpose, as described in DE 101 20 446 C1. The deformable free-form mirror 51 can be formed from a large number of micromirror segments which can be tilted individually via actuators associated therewith. Micromirror arrays of this type are known to a person skilled in the art. The tilting is activated by the correction mechanism in accordance with defined values calculated from the values determined by the correction sensors. There is sufficient space for the actuators of the micromirror array after the mirror 51, as no beam path extends at this location. Alternatively, a deformable free-form mirror can be configured as a monolithic mirror, there being attached to the back of the deformable free-form mirror actuators which are able to deform the mirror in the manner of a membrane.

Instead of the deformable free-form mirror 51, a static free-form mirror can also be used.

The projection optics 46 has an object/image offset of 0.

To manufacture a microstructured structural part with the aid of the projection exposure system 1, the reticle 9 and the wafer 10 are first provided. Subsequently, a structure on the reticle 9 is projected onto a light-sensitive layer of the wafer 10. As a result of this and by subsequent machining, a microstructure is produced on the wafer 10.

Other embodiments are in the claims.

What is claimed is:

1. A projection optics configured to image an object field in an object plane into an image field in an image plane, the projection optics comprising:
   a curved mirror; and
   a refractive subunit,
   wherein:
      the projection optics has an object/image offset which is less than 50 mm;
      an individual beam of an imaging beam path is a principal ray which connects a central object field point to a centrally illuminated point in a pupil of the projection optics in a pupil plane of the projection optics; and
      the projection optics is configured to be used in microlithography, and
   wherein at least one of the following holds:
      an intersection of an optical axis of the refractive subunit with the object plane is located in the object field; and
      an intersection of an optical axis of the refractive subunit with the image plane is located in the image field.

2. The projection optics according to claim 1, wherein the image plane is arranged parallel to the object plane.

3. The projection optics according to claim 1, wherein the object/image offset is zero.

4. The projection optics according to claim 1, wherein the intersection of an optical axis of the refractive subunit with the object plane is located in the object field.

5. The projection optics according to claim 4, wherein the intersection of the optical axis of the refractive subunit with the object plane is centred in the object field.

6. The projection optics according to claim 1, wherein the intersection of the optical axis of the refractive subunit with the image plane is located in the image field.

7. The projection optics according to claim 6, wherein the intersection of the optical axis of the refractive subunit with the image plane is centred in the image field.

8. The projection optics according to claim 1, wherein the projection optics comprises six mirrors.

9. The projection optics according to claim 1, wherein the refractive subunit has at most eight lenses.

10. The projection optics according to claim 1, comprising an image-side refractive subunit and an object-side refractive subunit, wherein there are at least two mirrors between the image-side refractive subunit and the object-side refractive subunit, at least one of the at least two mirrors has a free-form surface.

11. The projection optics according to claim 10, wherein an intersection of the optical axis of the object-side refractive subunit with the object plane is located in the object field, and an intersection of the optical axis of the image-side refractive subunit with the image plane is located in the image field.

12. The projection optics according to claim 11, wherein the intersection of the optical axis of the object-side refractive subunit with the object plane is centred in the object field, and the intersection of the optical axis of the image-side refractive subunit with the image plane is centred in the image field.

13. The projection optics according to claim 10, wherein a principal ray of a central field point between two mirrors arranged between the object-side and image-side refractive subunits extends parallel to the optical axis of the object-side and image-side refractive subunits and set apart from this optical axis.

14. The projection optics according to claim 10, wherein the optical axes of the object-side and image-side refractive subunits extend parallel and set apart from each other.

15. The projection optics according to claim 1, further comprising at least one mirror which is deformable in the region of a pupil plane of the projection optics.

16. The projection optics according to claim 1, wherein the projection optics is configured to illuminate an image field which is larger than 1 mm$^2$.

17. The projection optics according to claim 1, wherein the projection optics has an image-side numerical aperture of at least 0.5.

18. The projection optics according to claim 1, wherein the projection optics is telecentric on at least one of the object and image sides.

19. The projection optics according to claim 1, further comprising a light source configured to generate illumination light having a wavelength in the range of from 126 to 248 nm.

20. The projection optics according to claim 1, wherein the projection optics has at least one intermediate image plane in the imaging beam path between the object plane and the image plane.

21. The projection optics according to claim 20, wherein the refractive subunit is arranged between the intermediate image plane and the image plane.

22. A projection exposure system, comprising:
an illumination optics configured to guide illumination light toward an object field in an object plane; and
a projection optics according to claim 1,
wherein the projection exposure system is a microlithography projection exposure system.

23. A method, comprising:
projecting a structure of a reticle onto a light-sensitive layer of a wafer via a projection exposure system which comprises:
an illumination optics configured to guide illumination light toward an object field in an object plane; and
a projection optics according to claim 1.

* * * * *

UNITED STATES PATENT AND TRADEMARK OFFICE
CERTIFICATE OF CORRECTION

| | | |
|---|---|---|
| PATENT NO. | : 8,643,824 B2 | |
| APPLICATION NO. | : 13/045723 | |
| DATED | : February 4, 2014 | |
| INVENTOR(S) | : Hans-Juergen Mann | |

It is certified that error appears in the above-identified patent and that said Letters Patent is hereby corrected as shown below:

In the Specification

In Col. 5, line 9, delete "illuimination" and insert -- illumination --.

Signed and Sealed this
Twentieth Day of May, 2014

Michelle K. Lee
*Deputy Director of the United States Patent and Trademark Office*